US008362562B2

(12) United States Patent
Okihara

(10) Patent No.: US 8,362,562 B2
(45) Date of Patent: Jan. 29, 2013

(54) SEMICONDUCTOR DEVICE WITH SELECTED TRANSISTOR PROPERTIES

(75) Inventor: Masao Okihara, Miyagi (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 97 days.

(21) Appl. No.: 12/659,947

(22) Filed: Mar. 25, 2010

(65) Prior Publication Data
US 2010/0244135 A1 Sep. 30, 2010

(30) Foreign Application Priority Data
Mar. 27, 2009 (JP) ................. 2009-079127

(51) Int. Cl.
H01L 27/01 (2006.01)
H01L 27/12 (2006.01)
H01L 31/0392 (2006.01)
(52) U.S. Cl. .......... 257/351; 257/350; 257/E21.32; 257/E27.111; 257/E27.112; 257/E27.113
(58) Field of Classification Search .......... 257/350, 257/351, E21.32, E27.111, E27.112, E27.113
See application file for complete search history.

(56) References Cited

U.S. PATENT DOCUMENTS

| | | | | |
|---|---|---|---|---|
| 5,543,338 A | * | 8/1996 | Shimoji | 438/151 |
| 5,591,650 A | * | 1/1997 | Hsu et al. | 438/154 |
| 5,807,771 A | * | 9/1998 | Vu et al. | 438/154 |
| 5,892,260 A | * | 4/1999 | Okumura et al. | 257/347 |
| 6,407,425 B1 | * | 6/2002 | Babcock et al. | 257/318 |
| 6,509,583 B1 | * | 1/2003 | Iwamatsu et al. | 257/59 |
| 6,512,258 B2 | * | 1/2003 | Maeda | 257/303 |
| 7,132,683 B1 | * | 11/2006 | Krishnan et al. | 257/40 |
| 7,183,167 B2 | * | 2/2007 | Iwamatsu et al. | 438/296 |
| 7,303,950 B2 | * | 12/2007 | Yamaguchi et al. | 438/199 |
| 7,482,219 B2 | * | 1/2009 | Frohberg et al. | 438/224 |
| 7,800,150 B2 | * | 9/2010 | Yang | 257/295 |
| 7,838,349 B2 | * | 11/2010 | Matsumoto et al. | 438/154 |
| 7,943,995 B2 | * | 5/2011 | Kang et al. | 257/347 |
| 2003/0047782 A1 | * | 3/2003 | Hasegawa et al. | 257/347 |
| 2003/0102521 A1 | * | 6/2003 | Maeda et al. | 257/531 |
| 2003/0203544 A1 | * | 10/2003 | Chi | 438/149 |
| 2004/0101999 A1 | * | 5/2004 | Oda et al. | 438/197 |
| 2005/0095820 A1 | * | 5/2005 | van Bentum et al. | 438/478 |
| 2007/0045729 A1 | * | 3/2007 | Hoentschel et al. | 257/344 |
| 2007/0176235 A1 | * | 8/2007 | Tsujiuchi et al. | 257/347 |
| 2008/0160688 A1 | * | 7/2008 | Pan | 438/250 |

FOREIGN PATENT DOCUMENTS

JP 2003-086708 A 3/2003

* cited by examiner

Primary Examiner — Ida M Soward
(74) Attorney, Agent, or Firm — Rabin & Berdo, P.C.

(57) ABSTRACT

In a semiconductor device of a silicon on insulator (SOI) structure having uniform transistor properties, a first distance between a gate electrode forming position of an N type transistor and an end of a P type semiconductor region is greater than a second distance between a gate electrode forming position of the P type transistor and an edge of the N type semiconductor region.

5 Claims, 4 Drawing Sheets

SEMICONDUCTOR DEVICE WITH SELECTED TRANSISTOR PROPERTIES

BACKGROUND OF THE INVENTION

1. Field of the Invention

The present invention relates to a semiconductor device of a silicon on insulator (SOI) structure.

2. Description of the Related Background Art

In recent years, attention has been paid to a semiconductor device having a silicon on insulator (SOI) structure as a semiconductor device of low power consumption and high performance. FIG. 1 is a sectional view illustrating a general SOI device 500. As shown in FIG. 1, an SOI layer 530 composed of silicon is formed on a buried oxide film 520 (BOX; hereinafter, referred to as a BOX layer 520) formed on a silicon support substrate 510. The SOI layer 530 is separated from another SOI layer by an element separation oxide film formed at the surface of the BOX layer 520 using a local oxidation of silicon (LOCOS) method. In FIG. 1, the BOX layer 520 and the element separation oxide film are shown as one body. A gate electrode 540 is formed on the SOI layer 530. A side wall 550 is formed at each side of the gate electrode 540. A source (not shown) and a drain (not shown) are formed in the SOI layer 530. The source and drain constitute a field effect transistor, such as a complementary metal oxide semiconductor (CMOS), together with the gate electrode 540.

Since the BOX layer 520 is located below the SOI layer 530 in the SOI device as described above, parasitic capacitance of the source and the drain becomes small, thereby achieving low power consumption and high performance. In addition, since the SOI layers are separated from each other, a latch up phenomenon does not occur, thereby achieving high precision layout. For these reasons, the SOI device is advantageous as compared with a conventional bulk silicon CMOS device disclosed in, for example, Japanese Patent Application Publication No. 2003-86708.

However, it has been confirmed that, in the SOI device, large stress is generated in the vicinities of the ends of the SOI layer 530, i.e., in the vicinities of the interfaces between the SOI layer 530 and the BOX layer 520, and the stress affects properties of the device. Specifically, since the SOI layer 530 is surrounded by the BOX layer 520 as shown in FIG. 1, stress ST is generated at the both ends of SOI layer 530 in directions indicated by arrows, with the result that the properties of the device are affected.

When large compressive stress, generated in the vicinities of the ends of the SOI layer, is applied to a channel region formed at the SOI layer, the following effects are generated. That is, carrier mobility is decreased, and on current is decreased, in an N type MOS transistor (hereinafter, simply referred to as an N type transistor). On the other hand, carrier mobility is increased, and on current is increased, in a P type MOS transistor (hereinafter, simply referred to as a P type transistor).

In the semiconductor device of the SOI structure, therefore, stress generated at the ends of the SOI layer is applied to the channel region, resulting in the occurrence of bias in transistor properties between the N type transistor and the P type transistor.

SUMMARY OF THE INVENTION

The present invention has been made in view of the above problems, and it is an object of the present invention to provide a semiconductor device of a silicon on insulator (SOI) structure having uniform transistor properties.

In accordance with an aspect of the present invention, the above and other objects can be accomplished by the provision of a semiconductor device including a buried oxide formed on a support substrate, an N type semiconductor region and a P type semiconductor region formed on the buried oxide, a P type transistor formed in the N type semiconductor region, and an N type transistor formed in the P type semiconductor region, wherein a first distance between a gate electrode of the N type transistor and an edge of the P type semiconductor region is greater than a second distance between a gate electrode of the P type transistor and an edge of the N type semiconductor region.

In accordance with another aspect of the present invention, there is provided a semiconductor device including a buried oxide formed on a support substrate, a semiconductor region formed on the buried oxide, and at least two transistors formed in the semiconductor region such that the transistors are arranged in parallel, wherein a distance between a gate electrode of an outermost one of the transistors and an edge of the semiconductor region is set such that compressive stress is not applied to a channel region of the outermost transistor.

According to the present invention, it is possible to provide a semiconductor device of an SOI structure having uniform transistor properties.

DETAILED DESCRIPTION OF THE INVENTION

Hereinafter, embodiments of the present invention will be described in detail with reference to the accompanying drawings.

<First Embodiment>

Figure 1:
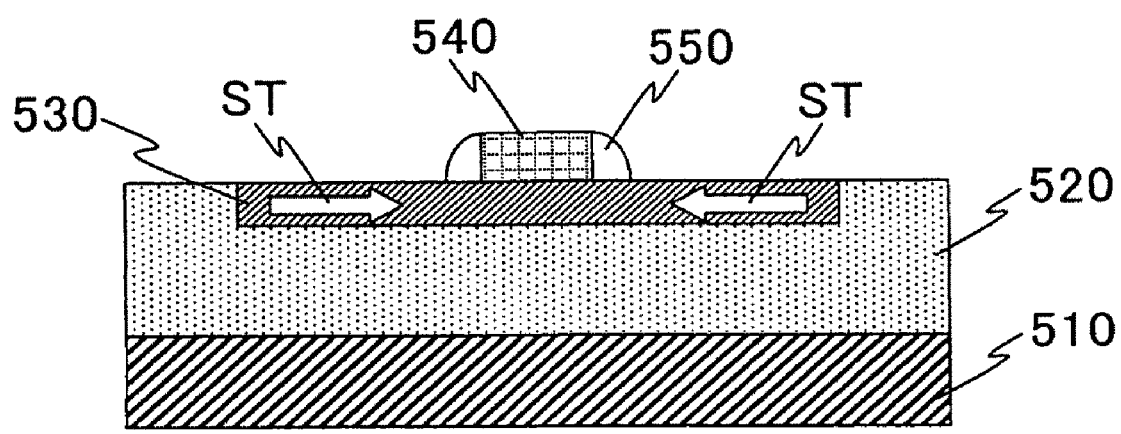
FIG. 1 is a sectional view illustrating a conventional semiconductor device of a silicon on insulator (SOI) structure.
Figure 2A:
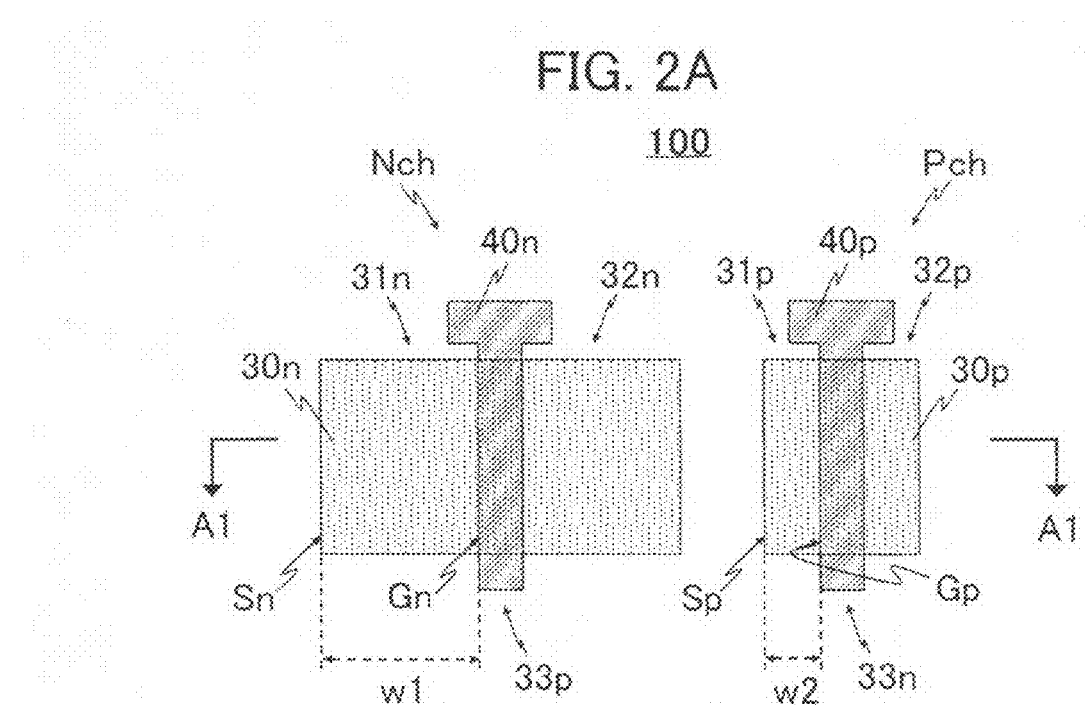
FIG. 2A is a top view illustrating a semiconductor device according to a first embodiment of the present invention.
Figure 2B:
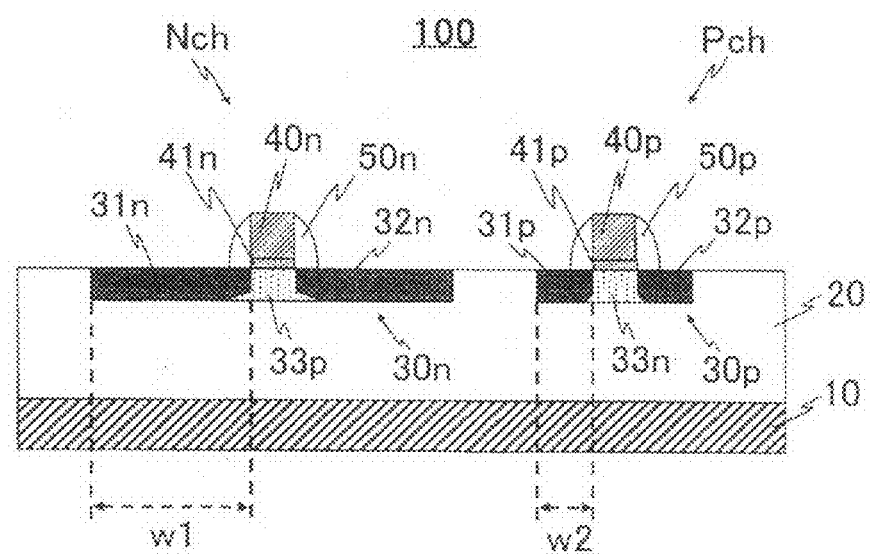
FIG. 2B is a sectional view taken along line A1-A1 of FIG. 2A.

FIG. 2A is a top view illustrating a semiconductor device 100 of this embodiment. FIG. 2B is a sectional view taken along line A1-A1 of FIG. 2A. Only gate electrodes and silicon on insulator (SOI) layers are shown in FIG. 2A for the convenience of description.

First, the structure of the semiconductor device 100 will be described with reference to the sectional view of FIG. 2B. The semiconductor device 100 is a device of an SOI structure. A buried oxide film 20 (BOX; hereinafter, referred to as a BOX layer 20), formed, for example, by oxygen ion implantation and thermal oxidation process, is provided on a support substrate 10 composed of, for example, single crystalline silicon. The BOX layer 20 has a thickness of, for example, approximately 100 nanometers. A P type semiconductor region, i.e., an SOI layer 30n, to constitute an N type field effect transistor Nch (hereinafter, simply referred to as an N type transistor Nch) and an N type semiconductor region, i.e., an SOI layer 30p, to constitute a P type field effect transistor Pch (hereinafter, simply referred to as a P type transistor Pch) are formed at the surface of the BOX layer 20. The SOI layer 30n and the SOI layer 30p are separated from each other by an element separation oxide film formed at the surface of the BOX layer 20 using, for example, a local oxidation of silicon (LOCOS) method. The BOX layer 20 and the element separation oxide film are shown as one body in FIG. 2B.

A source region 31n, a drain region 32n, and a channel region 33p are formed at the SOI layer 30n. A gate electrode 40n is formed on the channel region 33p via a gate oxide 41n having a thickness of, for example, 4 nanometers. The gate electrode 40n is composed of, for example, a poly silicon film formed on the gate oxide 41n. Side walls 50n composed of, for example, a silicon oxide, are formed at both sides of the gate electrode 40n for insulation. The gate electrode 40n, the source region 31n, and the drain region 32n constitute the N type transistor Nch.

A source region 31p, a drain region 32p, and a channel region 33n are formed at the SOI layer 30p. A gate electrode 40p is formed on the channel region 33n via a gate oxide film 41p having a thickness of, for example, 4 nanometers. The gate electrode 40p is composed of, for example, a poly silicon film formed on the gate oxide film 41p. Side walls 50p composed of, for example, a silicon oxide film, are formed at both sides of the gate electrode 40p for insulation. The gate electrode 40p, the source region 31p, and the drain region 32p constitute the P type transistor Pch.

Next, shapes of the SOI layers 30n and 30p and the gate electrodes 40n and 40p will be described with reference to the top view of FIG. 2A.

The SOI layer 30n to constitute the N type transistor Nch is formed in the shape of a rectangle when viewed from the top of the semiconductor device 100. The outer circumference of the SOI layer 30n abuts the BOX layer 20n (or the element separation oxide thereof).

The gate electrode 40n to constitute the N type transistor Nch is formed in the shape of T when viewed from the top of the semiconductor device 100. That is, the gate electrode 40n includes a part (hereinafter, referred to as an operating region gate electrode part) extending in a longitudinal direction, i.e., in a gate width direction, on the SOI layer 30n and a part (hereinafter, referred to as a contact gate electrode part) extending in a gate length direction outside the SOI layer 30n. These parts are formed as one body. The operating region gate electrode part is formed on the SOI layer 30n via the gate oxide film 41n. The operating region gate electrode part corresponds to an operating region of the N type transistor Nch. On the other hand, the contact gate electrode part is formed outside the SOI layer 30n, i.e., at the surface of the BOX layer 20n (or the element separation oxide film thereof). The contact gate electrode part is electrically connected to a wire line (not shown) formed at an upper layer thereof.

A distance W1 between a side Gn, extending in the gate width direction, of the operating region gate electrode part and an edge Sn (hereinafter, referred to as an end Sn) of a part, formed in parallel to the gate width direction, of the SOI layer 30n is 1.5 micrometers or more. At both the source region 31n side and the drain region 32n side, the distance W1 is 1.5 micrometers or more. Generally, the distance W1 at the source region 31n side is almost the same as the distance W1 at the drain region 32n side. That is, the channel region 33p formed below the gate electrode 40n and the end Sn of the SOI layer 30n are separated from each other by the distance W1. The gate electrode 40n has a gate length of, for example, approximately 0.2 micrometer although the gate length of the gate electrode 40n is not particularly restricted. Also, the gate electrode 40n has a gate width of, for example, approximately 0.2 to 10 micrometers although the gate width of the gate electrode 40n is not particularly restricted.

The SOI layer 30p to constitute the P type transistor Pch is formed in the shape of a rectangle when viewed from the top of the semiconductor device 100. The outer circumference of the SOI layer 30p abuts the BOX layer 20p (or the element separation oxide film thereof).

The gate electrode 40p to constitute the P type transistor Pch is formed in a T shape when viewed from the top of the semiconductor device 100. That is, the gate electrode 40p includes a part (hereinafter, referred to as an operating region gate electrode part) extending in a longitudinal direction, i.e., in a gate width direction, on the SOI layer 30p and a part (hereinafter, referred to as a contact gate electrode part) extending in a gate length direction outside the SOI layer 30p. These parts are formed as one body. The operating region gate electrode part is formed on the SOI layer 30p via the gate oxide film 41p. The operating region gate electrode part corresponds to an operating region of the P type transistor Pch. On the other hand, the contact gate electrode part is formed outside the SOI layer 30p, i.e., at the surface of the BOX layer 20p (or the element separation oxide film thereof). The contact gate electrode part is electrically connected to a wire line (not shown) formed at an upper layer thereof.

A distance W2 between a side Gp, extending in the gate width direction, of the operating region gate electrode part and an edge Sp (hereinafter, referred to as an end Sp) of a part, formed in parallel to the gate width direction, of the SOI layer 30p is 0.5 micrometer or less. At both the source region 31p side and the drain region 32p side, the distance W2 is 0.5 micrometer or less. Generally, the distance W2 at the source region 31p side is almost the same as the distance W1 at the drain region 32p side. That is, the channel region 33n formed below the gate electrode 40p and the end Sp of the SOI layer 30p are separated from each other by the distance W2. The gate electrode 40p has a gate length of, for example, approximately 0.2 micrometer although the gate length of the gate electrode 40p is not particularly restricted. Also, the gate electrode 40p has a gate width of, for example, approximately 0.2 to 10 micrometers although the gate width of the gate electrode 40p is not particularly restricted.

Hereinafter, effects obtained by setting the distance W1 to 1.5 micrometers or more and setting the distance W2 to 0.5 micrometer or less will be described.

Figure 3:
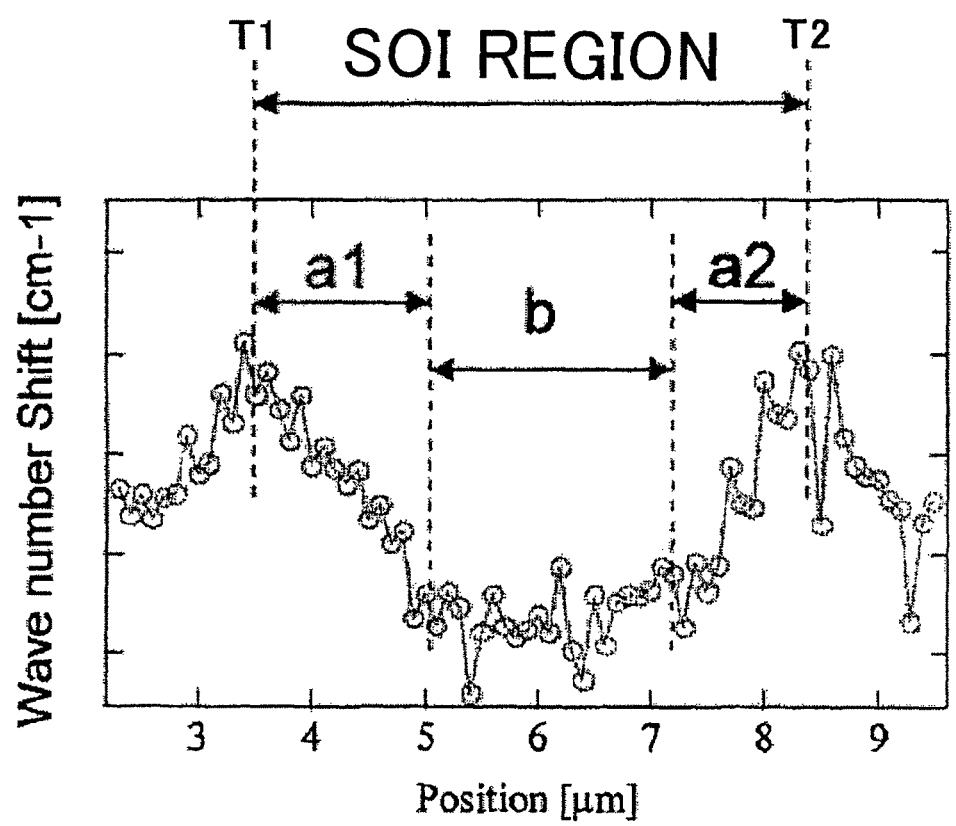
FIG. 3 is a graph illustrating a state of stress generated in an SOI layer measured using a Raman spectroscopic analysis method.

FIG. 3 is a graph illustrating a state of stress generated in an SOI layer of a semiconductor device of a SOI structure measured using a Raman spectral analysis method. The vertical axis indicates wave number shift of a Raman peak due to stress. The horizontal axis indicates positions in a channel forming direction. A gate electrode forming position is located in the vicinity of 6 micrometers on the horizontal axis. Also, a position T1 of one end of the SOI layer and a position T2 of the other end of the SOI layer are shown. As is apparent from FIG. 2A and FIG. 2B, wave number shift of a Raman peak is large in the vicinities of the positions T1 and T2 of the ends of the SOI layer. That is, compressive stress is concentrated in the vicinities of the positions T1 and T2 of the ends of the SOI layer. As a result of calculation of wave number shift of a Raman peak, it is understood that a compressive stress of approximately 50 to 100 MPa is concentrated in regions a1 and a2 defined within approximately 1.5 micrometers or less from the positions T1 and T2 of the ends of the SOI layer. On the other hand, it is understood that an almost distortion-free state is maintained in a region b defined in the vicinity of the middle of the SOI layer.

It has been confirmed that such a tendency is almost uniformly maintained although areas of the regions of the SOI layer are changed. Even when the regions of the SOI layer are enlarged, stress is concentrated in regions defined within approximately 1.5 micrometers or less from the ends of the SOI layer, and an almost distortion-free state is maintained in a region defined in the vicinity of the middle of the SOI layer. Also, it is confirmed from experiments that, when the width of the SOI layer in a channel forming direction is 3.0 micrometers or less, stress at the one end of the SOI layer overlaps with stress at the other end of the SOI layer, and almost uniform stress is generated over the entire region of the SOI layer.

In light of such results, the following effects are obtained when the distance W1 is set to 1.5 micrometers or more and the distance W2 is set to 0.5 micrometer or less, as in the semiconductor device 100 according to this embodiment. That is, since, in the N type transistor Nch, the channel region 33p is formed at a position 1.5 micrometers or more remote from the end Sn of the SOI layer 30n, i.e., at a distortion-free region, the channel region 33p is not subjected to stress, thereby obtaining the effect of restraining the decrease of on current due to the decrease of carrier mobility. On the other hand, since, in the P type transistor Pch, the channel region 33n is formed at a position 0.5 micrometer or less remote from the end Sp of the SOI layer 30p, i.e., at a region where stress from the both ends of the SOI layer 30p is applied, the entire region of the channel region 33n is subjected to stress, thereby obtaining the effect of achieving the increase of on current due to the increase of carrier mobility. Therefore, it is possible to prevent the occurrence of bias in transistor properties between the N type transistor and the P type transistor.

In the semiconductor device according to this embodiment as described above, it is possible to provide a semiconductor device of an SOI structure having uniform transistor properties in that on current is large and bias does not occur for both the N type transistor and P type transistor.

<Second Embodiment>

Figure 4:
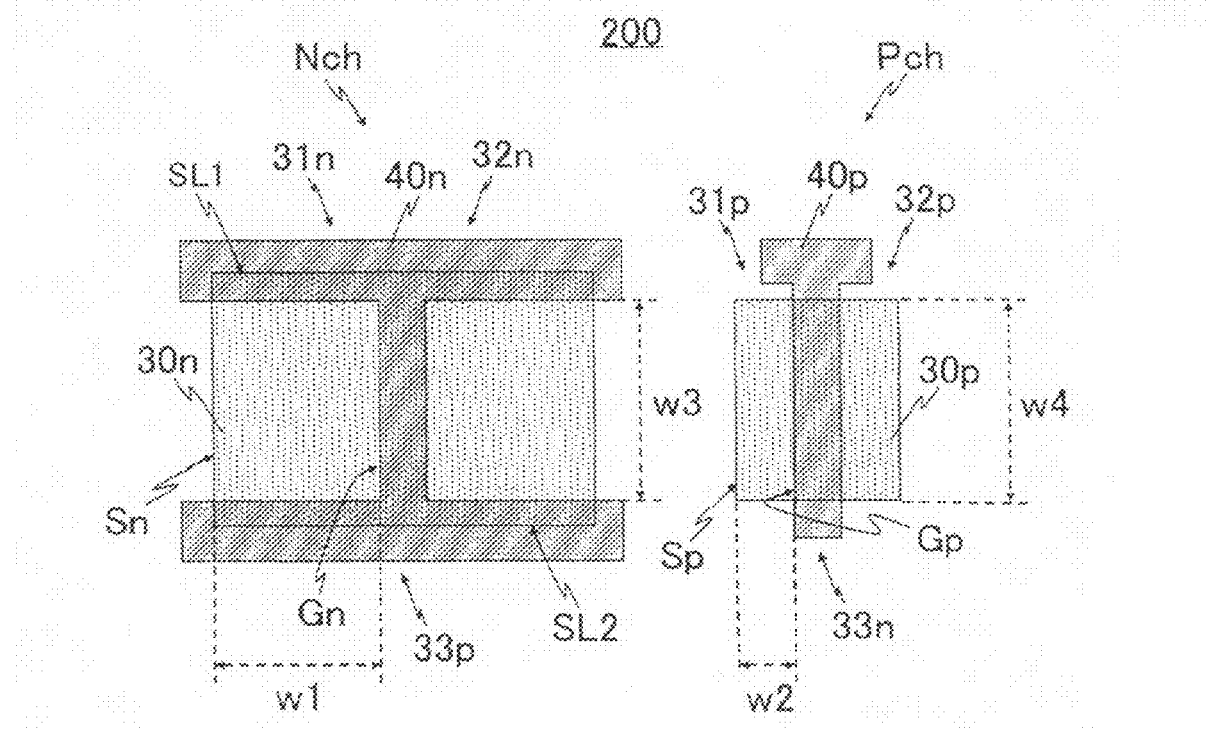
FIG. 4 is a top view illustrating a semiconductor device according to a second embodiment of the present invention.

FIG. 4 is a top view illustrating a semiconductor device 200 according to this embodiment. Only SOI layers 30n and 30p and gate electrodes 40n and 40p are shown in FIG. 4 for the convenience of description. Hereinafter, parts of this embodiment different from those of the first embodiment will be mainly described with reference to FIG. 4.

The gate electrode 40n to constitute an N type transistor Nch is formed in an H shape (laterally facing in FIG. 4) when viewed from the top of the semiconductor device 200. That is, the gate electrode 40n includes a part (hereinafter, referred to as an operating region gate electrode part) extending in a gate width direction on a transistor operating region of the SOI layer 30n and parts (hereinafter, referred to as end gate electrode parts) extending in a gate length direction to cover edges SL1 and SL2 (hereinafter, referred to as ends SL1 and SL2) of parts formed in parallel to the gate length direction at edges of the SOI layer 30n. These parts are formed as one body.

One of the end gate electrode parts is formed over the entirety of the end SL1 of the SOI layer 30n via a gate oxide film, and the other of the end gate electrode parts is formed over the entirety of the end SL2 of the SOI layer 30n via the gate oxide film. The operating region gate electrode part extends in the gate width direction in the transistor operating region of the SOI layer 30n. Each of the end gate electrode parts has a gate length sufficiently greater than a gate length of the operating region gate electrode part. The operating region gate electrode part has a gate length of, for example, approximately 0.2 micrometer, and each of the end gate electrode parts has a gate length of, for example, approximately 3.5 micrometers. In the same manner as the first embodiment, a distance W1 is set to 1.5 micrometers or more at both a source region 31n side and a drain region 32n side. That is, a channel region 33p formed below the gate electrode 40n and the end Sn of the SOI layer 30n are separated from each other by the distance W1.

When the gate electrode 40n is formed as described above, the following effects are obtained. That is, since the gate length is short in the transistor operating region of the SOI layer 30n, transistor on resistance is low, and therefore, electric current flows in the channel region. On the other hand, since the gate length is sufficiently long in the ends of the SOI layer 30n, transistor on resistance is high, and therefore, electric current does not flow in the channel region. Consequently, it is possible to diminish an influence which stress generated at the ends SL1 and SL2 of the SOI layer 30n in the gate width direction exerts on carrier mobility. That is, in the N type transistor Nch, it is possible to obtain the effect of restraining the decrease of on current due to the decrease of carrier mobility.

On the other hand, the gate electrode 40p to constitute the P type transistor Pch is formed in a T shape when viewed from the top of the semiconductor device 200 in the same manner as in the first embodiment. Also, a distance W2 is set to 0.5 micrometer or less at both a source region 31p side and a drain region 32m side, in the same manner as the first embodiment. The distance between a channel region 33n formed below the gate electrode 40p and an end Sp of the SOI layer 30p is 0.5 micrometer or less.

When the gate electrode 40p is formed as described above, the entire channel region of the P type transistor Pch is subjected to stress, thereby obtaining the effect of achieving the increase of on current due to the increase of carrier mobility.

In the N type transistor Nch, the region defined between the end gate electrode part formed on the end SL1 of the SOI layer 30n and the end gate electrode part formed on the end SL2 of the SOI layer 30n, i.e., the transistor operating region, has a width W3 in the gate width direction. The width W3 is almost equal to a width W4 of the SOI layer 30p of the P type transistor Pch in the gate direction. The width W3 and the width W4 are, for example, 0.2 to 10 micrometers. When the N type transistor and the P type transistor have different transistor properties, the width W3 and the width W4 may be set to different values to adjust carrier mobility or an on resistance value.

In the semiconductor device according to this embodiment as described above, the gate electrode of the N type transistor has the parts extending in the gate length direction to cover the edges of the parts formed in parallel to the gate length direction at the edges of the SOI layer, and the gate length of each of the parts has a sufficiently greater than the gate length of the transistor region. In such a structure, it is possible to further improve the effect of restraining the decrease of on current due to the decrease of carrier mobility in the N type transistor Nch. The effect may be obtained even when only one of the both ends of the gate electrode 40n has a long gate length.

Also, since the distance W1 is set to 1.5 micrometers or more, and the distance W2 is set to 0.5 micrometer or less, in the same manner as in the first embodiment, it is possible to prevent the occurrence of bias in transistor properties between the N type transistor and the P type transistor.

In the semiconductor device according to this embodiment as described above, it is possible to provide a semiconductor device of an SOI structure having uniform transistor properties in that on current is large and bias does not occur for both the N type transistor and N type transistor.

<Third Embodiment>

Figure 5:
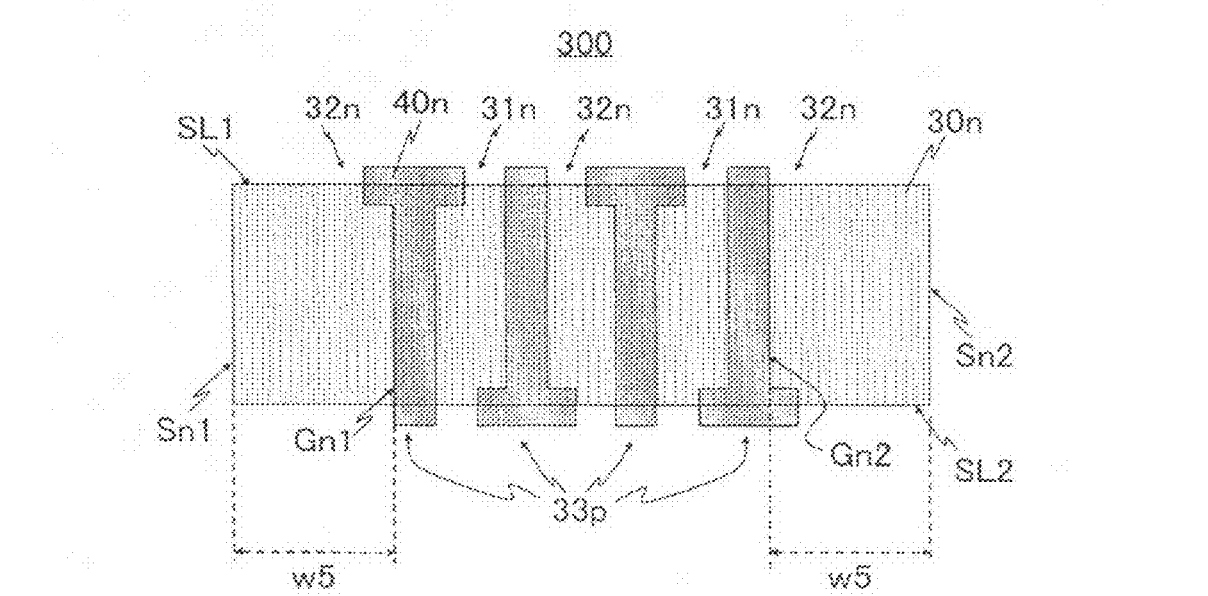
FIG. 5 is a top view illustrating a semiconductor device according to a third embodiment of the present invention.

FIG. 5 is a top view illustrating a semiconductor device 300 according to this embodiment. Only an SOI layer 30n and a gate electrode 40n are shown in FIG. 5 for the convenience of description. The semiconductor device 300 is a device of an SOI structure that is used in a field requiring high precision, such as an analog circuit. Hereinafter, the semiconductor device 300 will be described as an N channel type SOI device. The SOI structure of the semiconductor device 300 is the same as that described in connection with the first embodiment. Hereinafter, shapes of the SOI layer 30n and the gate electrode 40n will be described with reference to FIG. 5.

The SOI layer 30n, which is a semiconductor region, is formed in the shape of a rectangle when viewed from the top of the semiconductor device 300. The outer circumference of the SOI layer 30n abuts a BOX layer 20n (or an element separation oxide film thereof).

The gate electrode 40n is formed in a T shape when viewed from the top of the semiconductor device 300. That is, the gate electrode 40n includes a part (hereinafter, referred to as an operating region gate electrode part) extending in a longitudinal direction, i.e., in a gate width direction, on the SOI layer 30n and a part (hereinafter, referred to as an end electrode part) extending in a gate length direction to cover an edge (hereinafter, referred to as an end SL1 or SL2) of a part formed in parallel to the gate length direction at an edge of the SOI layer 30n. These parts are formed as one body.

As shown in FIG. 5, a plurality of gate electrodes 40n are arranged on the SOI layer 30n in parallel in the gate length direction. Source regions 31n and drain regions 32n are alternately formed between neighboring gate electrodes 40n. Channel regions 33p are formed below the respective gate electrodes 40n. That is, a plurality of transistors are formed in the semiconductor device 300 in such a manner that the transistors are arranged in parallel in the gate length direction. Also, the neighboring gate electrodes 40n are formed such that the T-shaped directions of the gate electrodes 40n are opposite to each other. That is, the gate electrodes 40n are formed such that the gate lengths of the gate electrodes 40n, which are arranged in parallel, are alternately long and short at both the end SL1 and the end SL2 of the SOI layer 30n.

A distance W5 between a side Gn1, extending in the gate width direction, of the left outermost one of the gate electrodes 40n and an edge Sn1 (hereinafter, referred to as an end Sn1) of a part formed in parallel to the gate width direction at an edge of the SOI layer 30n is 1.5 micrometers or more. Also, a distance W5 between a side Gn2, extending in the gate width direction, of the right outermost one of the gate electrodes 40n and an edge Sn2 (hereinafter, referred to as an end Sn2) of a part formed in parallel to the gate width direction at an edge of the SOI layer 30n is 1.5 micrometers or more. That is, the channel region 33p formed below each of the outermost gate electrodes 40n and the corresponding end Sn1 or Sn2 of the SOI layer 30n are separated from each other by 1.5 micrometers or more. Each of the gate electrodes 40n has a long gate length of, for example, approximately one micrometer and a short gate length of, for example, approximately 0.2 micrometer at the end Sn1 or Sn2 thereof although the gate length of each of the gate electrodes 40n is not particularly restricted. Also, each of the gate electrodes 40n has a gate width of, for example, approximately 0.2 to 10 micrometers although the gate width of each of the gate electrodes 40n is not particularly restricted.

When the SOI layer 30n and the gate electrodes 40n are formed as described above, the following effects are obtained. That is, since the side Gn1 or Gn2 of each of the outermost gate electrodes 40n is formed at a position 1.5 micrometers or more remote from the corresponding end Sn1 or Sn2 of the SOI layer 30n, i.e., at a distortion-free region, the channel regions 33p formed below the respective gate electrodes 40n are not subjected to stress.

In addition, since the gate length of each of the gate electrodes 40n is short in the transistor operating region of the SOI layer 30n, transistor on resistance is low, and therefore, electric current flows in the channel regions. On the other hand, since the gate length of each of the gate electrodes 40n is sufficiently long in the end SL1 or SL2 of the SOI layer 30n, transistor on resistance is high, and therefore, electric current does not flow in the channel regions. Consequently, it is possible to diminish an influence which stress generated at the ends SL1 and SL2 of the SOI layer 30n exerts on carrier mobility.

That is, since any one of the transistors formed in the semiconductor device 300 is not subjected to stress, it is possible to prevent the change in transistor properties, such as carrier mobility or on resistance, of each of the transistors. In the above example, the semiconductor device 300 is an N channel type SOI device. In a case in which the semiconductor device 300 is a P channel type SOI device, however, the structure is the same.

In the semiconductor device according to this embodiment as described above, it is possible to prevent the respective channel regions from being affected by compressive stress generated at the ends of the SOI layer in the SOI device constructed such that the gate electrodes, the source region, and the drain region are arranged in parallel. As a result, it is possible to provide a semiconductor device of an SOI structure in which the respective transistors have uniform transistor properties.

This application is based on Japanese Patent Application No. 2009-079127 filed on Mar. 27, 2009, and the entire disclosure thereof is incorporated herein by reference.

What is claimed is:

1. A semiconductor device comprising:
   a buried oxide film formed on a support substrate;
   an N type semiconductor region and a P type semiconductor region formed on the buried oxide film;
   a P type transistor formed in the N type semiconductor region; and
   an N type transistor formed in the P type semiconductor region, wherein the N-type semiconductor region includes a source region, a channel region and a drain region of the P type transistor, the P type semiconductor region includes a source region, a channel region and a drain region of the N type transistor, and the N type semiconductor region and the P type semiconductor region are separated from each other, and wherein
   a first distance between a gate electrode of the N type transistor and an edge of the P type semiconductor region is greater than a second distance between a gate electrode of the P type transistor and an edge of the N type semiconductor region.

2. The semiconductor device according to claim 1, wherein the first distance is 1.5 micrometers or more.

3. The semiconductor device according to claim 1, wherein the second distance is 0.5 micrometer or less.

4. The semiconductor device according to claim 1, wherein at least one end of a gate electrode of the N type transistor and at least one end of a gate electrode of the P type transistor are formed in a T shape.

5. The semiconductor device according to claim 1, wherein at least one end of a gate electrode of the N type transistor extends in a gate length direction to cover the edge of the P type semiconductor region.

* * * * *